United States Patent [19]

Miyachi et al.

[11] Patent Number: 5,656,398
[45] Date of Patent: Aug. 12, 1997

[54] METHOD OF MAKING X-RAY MASK STRUCTURE

[75] Inventors: Takeshi Miyachi, Zama; Yasuaki Fukuda, Hadano; Keiko Chiba, Isehara, all of Japan

[73] Assignee: Canon Kabushiki Kaisha, Tokyo, Japan

[21] Appl. No.: 479,358

[22] Filed: Jun. 7, 1995

Related U.S. Application Data

[63] Continuation of Ser. No. 148,413, Nov. 8, 1993, abandoned, which is a continuation of Ser. No. 977,744, Nov. 16, 1992, abandoned, which is a continuation of Ser. No. 742,518, Aug. 6, 1991, abandoned, which is a continuation of Ser. No. 413,475, Sep. 27, 1989, abandoned.

[30] Foreign Application Priority Data

Sep. 30, 1988 [JP] Japan ................. 63-243912
Sep. 30, 1988 [JP] Japan ................. 63-243916
Sep. 30, 1988 [JP] Japan ................. 63-243918
Aug. 31, 1989 [JP] Japan ................. 1-223276

[51] Int. Cl.$^6$ ................................. G03F 9/00
[52] U.S. Cl. ................... 430/5; 430/296; 378/34; 378/35
[58] Field of Search .............. 430/5, 296; 378/34, 378/35; 205/181

[56] References Cited

U.S. PATENT DOCUMENTS

| | | | |
|---|---|---|---|
| 3,927,943 | 12/1975 | Pohl et al. | 355/132 |
| 4,522,842 | 6/1985 | Levinstein et al. | 430/5 |
| 4,735,877 | 4/1988 | Kato et al. | 430/5 |
| 4,814,615 | 3/1989 | Fushimi et al. | 250/311 |
| 4,833,051 | 5/1989 | Imamura | 430/5 |
| 4,837,114 | 6/1989 | Hamada et al. | 427/127 |
| 4,863,805 | 9/1989 | Suzuki et al. | 428/558 |
| 4,881,257 | 11/1989 | Nakagawa | 430/5 |
| 4,917,778 | 4/1990 | Takada et al. | 204/32.1 |
| 4,925,755 | 5/1990 | Yamaguchi et al. | 430/5 |
| 4,958,074 | 9/1990 | Wolf et al. | 250/309 |
| 4,963,921 | 10/1990 | Kariya et al. | 355/53 |

FOREIGN PATENT DOCUMENTS

| | | | |
|---|---|---|---|
| 3620970 | 1/1987 | Germany. | |
| 15256 | 7/1978 | Japan | 378/35 |
| 60-68340 | 4/1985 | Japan. | |
| 0249066 | 5/1987 | Japan | 430/5 |
| 0293614 | 12/1987 | Japan | 430/5 |
| 0051633 | 3/1988 | Japan | 430/5 |

OTHER PUBLICATIONS

Thompson, L. F. et al, Introduction to Microlithography, ACS Symposium Series, American Chemical Society, Washington D.C., 1983, pp. 63–70.

Webster's New World Dictionary, 1988, Neufeldt & Guralnik, p. 1177.

Patent Abstracts of Japan 62–109053, vol. 11, No. 324, Oct. 1987.

Patent Abstracts of Japan 60–251621, vol. 10, No. 117, May 1986.

Patent Abstracts of Japan 60–77424, vol. 9, No. 216, Sep. 1985.

*Primary Examiner*—S. Rosasco
*Attorney, Agent, or Firm*—Fitzpatrick, Cella, Harper & Scinto

[57] ABSTRACT

A method of making an X-ray mask structure having an X-ray absorber in a desired pattern on the surface of a support film held by a frame. The method includes a step of patterning the X-ray absorber, including a drawing step that utilizes charged particles, and a step of thereafter providing the frame with a magnetic member. The frame and the support film each include a non-magnetic material.

30 Claims, 3 Drawing Sheets

METHOD OF MAKING X-RAY MASK STRUCTURE

This application is a continuation of prior application, Ser. No. 08/148,413 filed Nov. 8, 1993, which application is a continuation of prior application, Ser. No. 07/977,744 filed Nov. 16, 1992, which application is a continuation of prior application, Ser. No. 07/742,518 filed Aug. 6, 1991, which application is a continuation of prior application, Ser. No. 07/413,475 filed Sep. 27, 1989, all now abandoned.

BACKGROUND OF THE INVENTION

1. Field of the Invention

The present invention relates to a method of making a mask structure (or a structural body) used in X-ray lithography. More particularly, the present invention relates to a method of making an X-ray mask structure that can be fixed to an apparatus body by magnetic chucking.

2. Related Background Art

Various methods have been hitherto employed in lithographic processing of electronic devices such as IC and LSI. In particular, X-ray lithography is based on properties inherent to X-rays, as exemplified by high transmittance (or low absorbance) and short wavelength. X-ray lithography has a number of advantages when compared with conventional lithographic methods that utilize visible light or ultraviolet light, and has attracted notice as a promising method for submicroscopic lithography.

Mask structures used in X-ray lithography are commonly prepared in the following way.

First, a thin film (a support film) comprising a material having a high X-ray transmittance is formed on a holding frame for holding the film, and thereafter, an X-ray absorber, such as Au, Ta and W formed into patterns corresponding to a shape to be transformed, is formed on the film.

Because of the use of soft X-rays of about 0.5 to 2 nm in X-ray lithography, X-rays may be so greatly attenuated in the atmosphere that exposure is required to be operated in a vacuum or in low-pressure helium. Now, as a method of fitting the X-ray mask structure to an apparatus body in such X-ray lithography, a magnetic chucking method has been proposed in which a magnetic force is utilized in place of vacuum attraction, as disclosed in Japanese Patent Application Laid-Open No. 60-68340. When, however, the material of the holding frame is made of a magnetic material as proposed in the Japanese Patent Application No. 60-68340, a force based on the Lorentz force is exerted on moving electric-charged particles (Electrons), because of its residual magnetic flux (density) to cause misregistration from a given position, creating a problem that the position accuracy in drawing X-ray absorber patterns and the measurement accuracy in carrying out quality inspection on X-ray mask structures are extremely lowered.

In the above proposal, the magnetic material, such as metal, constituting at least a part of the holding frame, is apt to rust, often bringing about the problem that the rust causes parallel warpage when the mask structure is fixed to the apparatus body.

SUMMARY OF THE INVENTION

Accordingly, an object of the present invention is to provide an improved method of making an X-ray mask structure to which the magnetic chucking can be applied under a reduced-pressure or under vacuum exposure conditions.

Another object of the present invention is to provide a method of making an X-ray mask structure that can remarkably reduce defective portions.

The above objects can be achieved by the present invention described below.

The present invention is a method of making an X-ray mask structure having an X-ray absorber in a desired pattern on the surface of a support film held by a frame;

wherein the frame and the support film are each comprised of a non-magnetic material; and the method comprises a step of patterning the X-ray absorber, including a drawing step that utilizes charged particles, and a step of thereafter providing the frame with a magnetic member.

In another embodiment, the present invention is a method of making an X-ray mask structure having an X-ray absorber in a desired pattern on the surface of a support film held by a frame;

wherein the frame and the support film are each comprised of a non-magnetic material; and the method comprises a step of patterning the X-ray absorber, including a drawing step that utilizes charged particles, and a step of thereafter joining the frame to a reinforcement member, the whole or a part of which is comprised of a magnetic member.

In still another embodiment, the present invention is a method of making an X-ray mask structure having an X-ray absorber in a desired pattern on the surface of a support film held by a frame;

wherein the frame and the support film are each comprised of a non-magnetic material; and the method comprises a step of patterning the X-ray absorber, including a drawing step that utilizes charged particles, and a step of thereafter embedding a magnetic member in a recession in the frame.

DETAILED DESCRIPTION OF THE PREFERRED EMBODIMENTS

The present invention will be described below in detail by giving preferred embodiments based on the examples illustrated in the drawings.

All films conventionally used as support films can be used as the support film used in the X-ray mask structure obtained according to the present invention, as exemplified by inorganic films of single materials such as beryllium (Be), titanium (Ti), silicon (Si) and boron (B) or compounds of any of these, and organic films of polyimide, polyamide, polyester and Poly(para-xylylene), or composite films of these. These support films are X-ray transparent and may preferably have a thickness of from 0.5 to 5 μm in the case of the inorganic films and from 1 to 20 μm in the case of the organic films so that the transmittance of X-rays can be made as high as possible.

Figure 1A:
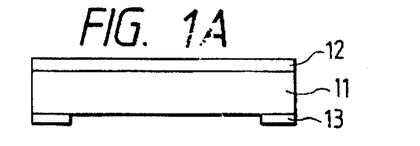
FIGS. 1A to 1G, 2A to 2F and 3A to 3F are all schematic cross sections of X-ray mask structures, to illustrate working examples of the present invention.
Figure 1B:
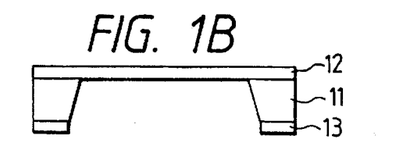

In forming these support films, hitherto known methods can be employed. For example, as schematically illustrated in FIGS. 1A to 1G and 2A to 2F, a support film 12 as described above is formed on a silicon wafer (holding frame) 11 (FIG. 1A). Subsequently, a protective film 13 (a silicon nitride film or the like) for etching is provided on a portion of the back surface thereof, and then the silicon wafer 11 is etched with an aqueous 30 wt % potassium hydroxide solution. As a result, the support film 12 held on the holding frame 11 is formed (FIG. 1B).

Figure 2A:
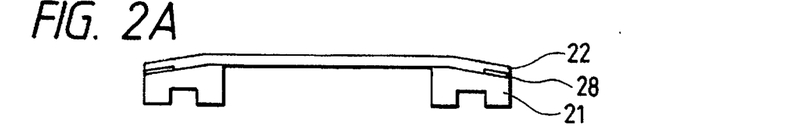

As shown in FIGS. 2A to 2F, a support film 22 may be tensioned, and thus fixed by adhesion on a holding frame 21, using an adhesive 28. The holding frame 21 may be made of any suitable material including ceramics and low-expansion glass, as long as they are non-magnetic materials (FIG. 2A). The adhesive 28 may be an adhesive having an adhesive force by which the tensioned support film 22 may not be removed, and there may be used, for example, epoxy resin or rubber adhesives.

Figure 1C:
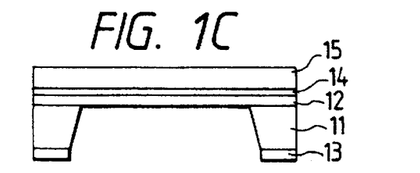
Figure 1D:
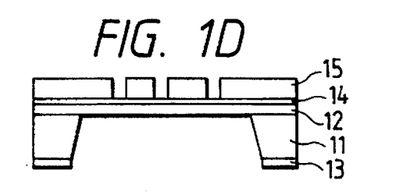
Figure 1E:
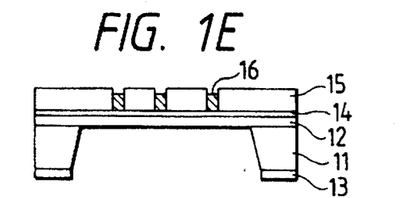
Figure 2B:
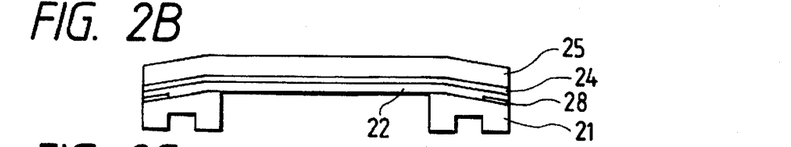
Figure 2C:
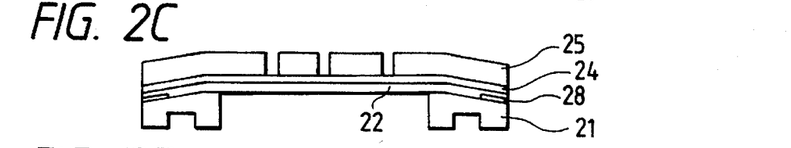
Figure 2D:
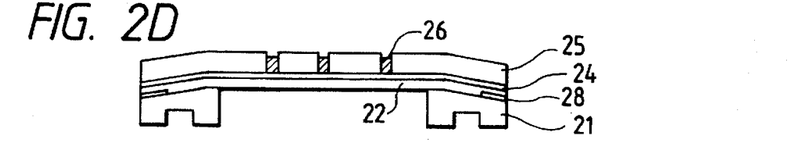

Any X-ray absorbers used in conventional X-ray mask structures can be used as an X-ray absorber 16 or 26 formed on the above support film 12 or 22, without any particular limitations, including thin films (with a thickness of, for example, from 0.5 to 1 μm in approximation) of materials commonly having a high density as exemplified by gold, platinum, tungsten, copper, tantalum, and compounds containing these. In forming such an X-ray absorber 16 or 26, a plating electrode layer 14 or 24 is previously provided (FIG. 1C, FIG. 2B). Metals such as Cu and Au are used as materials for the electrode layer 14 or 24. A resist layer 15 or 25 is further provided thereon in a single layer or in multiple layers. Thereafter, the resist layer 15 or 25 is subjected to patterning according to an electron-beam drawing method (FIG. 1D, FIG. 2C). Subsequently, the surface of the electrode layer 14 or 24 is plated with Au for the X-ray absorber 16 or 26 in accordance with the resist pattern (FIG. 1E, FIG. 2D).

Figure 1F:
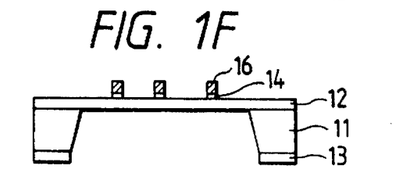
Figure 2E:
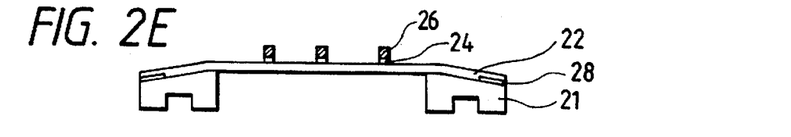

Thereafter, the resist layer 15 or 25 and successively, the electrode layer 14 or 24 other than the absorber 16 or 26 comprising Au provided by plating are removed from the support film 12 or 22 (FIG. 1F, FIG. 2E.).

Figure 1G:
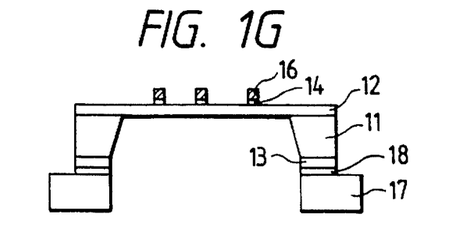
Figure 2F:
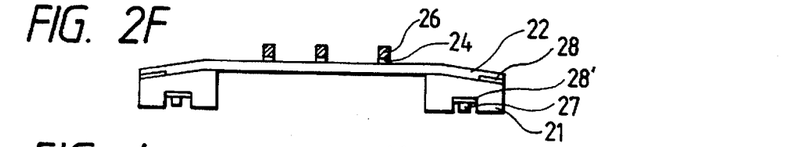

On the X-ray mask structure having been passed through the above procedure, the pattern accuracy is commonly examined using an Electron Beam Metrogy System and a Laser Interferometric X-Y Measuring Machine Model 2L. In the present invention, a reinforcement member 17, the whole or a part of which is comprised of a magnetic material, is further fixed on the above X-ray mask structure, using an adhesive 18 (FIG. 1G), or a magnetic member 27 is embedded in a recession made in the holding frame 21 and fixed therein using an adhesive 28' (FIG. 2F).

Such a reinforcement member 17 or magnetic member 27 comprises a magnetic material such as iron, cobalt, nickel, or an alloy or compound of any of these, and all of the conventionally known magnetic members can be used.

The reinforcement member 17 may be comprised of magnetic material as a whole, or it may be a combination of a non-magnetic material such as glass or ceramics with the above magnetic material. The shape of the reinforcement member may be the same as the holding frame or of a similar design thereto, and there are no particular limitations, as long as it is of a shape capable of holding the holding frame.

The fixing to the holding frame 11 may be carried out by any suitable fixing means such as by press fitting, screw fitting, a screw stopper, and adhesion using the adhesive 18. However, taking into account the strain, stability, etc. of the magnetic member when fixed, it is preferred to use the adhesive 18 of the type which causes less constriction when set up, as exemplified by epoxy resin rubber, acrylic resin and polyimide resin adhesives.

The magnetic member 27 may be fixed to the holding frame 21 by any suitable fixing means such as by press fitting, screw fitting, a screw stopper, and adhesion using the adhesive 28'. In the case of fixing the member 27 by adhesion, the fixing is preferred to be carried out using the epoxy resin, rubber, acrylic resin, polyimide resin, etc.

The prepartion method of the present invention is characterized in that, in forming the mask support described above, the reinforcement member 17 which is a magnetic member or the magnetic member 27 is fixed on the holding frame 11 or 21 after the formation of and inspection of the X-ray absorber pattern 16 or 26 has been completed. In other words, if the the mask pattern 16 is formed after the fixing of the reinforcement member 17, a slight residual magnetic field ascribable to the magnetic member causes deflection of the direction of electron beams and ion beams used in patterning, but the fixing of the reinforcement member 17 which is a magnetic member or the magnetic member 27 after the patterning has been completed as in the present invention can eliminate such a difficulty.

One face (the face or side used for chucking) of the magnetic member used in the present invention may be abraded to have a surface roughness of not more than 0.2 μm and a flatness of not more than 2 μm, whereby the gap to the mask chuck of the exposure apparatus side can be reduced and chucking by magnetic force can be made firmer.

The magnetic member used in the present invention is a magnetic member having the possibility of rusting as exemplified by ion, nickel, cobalt, or alloys thereof. Rustproofing for these magnetic members may be carried out by forming a coating film of resin coating composition commonly available. However, such a resin coating film, because of its insufficiency in hardness, strength, wear resistance, etc., is liable to lower the accuracy of the mask structure or is required to be formed with a large thickness, because of its insufficiency in hardness, strength, wear resistance, etc., so that there is a possibility of lowering the magnetic characteristics of the magnetic member.

Hence, preferred rustproofing is to apply a coating using ceramics such as TiN, SiC, $Si_3N_4$, $Al_2O_3$ and TiC, or to apply metal plating such as Kanigen plating of nickel. Such ceramic coating or metal plating enable low-temperature coating, and hence, the resulting coating can be free from deformation of the magnetic member due to heat shock. It also can be free from pinholes. Furthermore, it is hard, and has excellent wear resistance. Thus, a thin film with a thickness of, for example, from 0.1 to 5 μm in approximation can achieve a sufficient rustproofing effect. Since such a thin film can be sufficient, it also may not occur that the magnetic characteristics of the magnetic member is lowered. A thickness less than 0.1 μm, of the thin film may result in deterioration with respect to its strength such as wear resistance, and a thickness more than 5 μm may lower the magnetic characteristics.

EXAMPLES

The present invention will be described below in further detail by giving Examples.

Example 1

A first example of the present invention will be described with reference to FIG. 1.

On the silicon wafer 11, a support film 12 comprising SiN (thickness: 2 μm) and an etching protective film 13 were formed by an LP-CVD process. The etching protective film 13 was subjected to patterning in the desired back-etched form. The silicon wafer 11 was further back-etched for several hours in a 30 wt. % KOH solution (70° C.). On the support film 12, the plating electrode 14 was provided by resistive heating deposition of Cr and Au, successively. OEBR-1000 (trade name; Tokyo Ohka Kogyo Co., Ltd.) was further coated as an electron-beam resist 15 with a thickness of 1 μm. In an electron-beam drawing apparatus MEBES-III (trade name; manufactured by Perkin Elmer Co.), a resist pattern was formed under conditions of an accelerating voltage of 20 KV and a beam current of 100 nA. Using a gold-plating solution Neutronex 309 (trade name; a product of EEJA Co.), gold-plating was carried out to form a gold absorber pattern 16 (0.8 μm thick), and then the resist 15 was peeled. The electrode metal 14 was also removed by dry etching.

The accuracy of the absorber pattern 16 was inspected using the Electron Beam Metrogy System [S-6000 (trade name; manufactured by Hitachi Ltd.)] and the Laser Interferometric X-Y Measuring Machine Model 2I [Lampus A2 (trade name; manufactured by Nikon Co.)]. As a result, it was possible to form an absorber pattern of 0.25 μm L/S corresponding to 256M DRAM with a position accuracy of 0.1 μm.

To the resulting mask structure, a reinforcement member 17 comprised of a magnetic member martensite stainless steel (SUS403) was adhered using an epoxy adhesive EP007 (trade name; a product of Cemedine Co., Ltd.). Used as the reinforcement member 17 was the one previously processed to have a flatness of 1 μm and a surface roughness of 0.1 μm on the side which was not adhered to the holding frame 11, and subjected to rustproofing by further providing a SiN film (0.5 μm) on the surface.

Example 2

A second example of the present invention will be described with reference to FIGS. 2A to 2F.

Riverceram SNB-10 (trade name; manufactured by Kawasaki Steel Corporation) was used as the holding frame 21. Kapton film (thickness: 7.5 μm; trade name; a product of Toray Industries, Inc.) was used as the support film, and adhered on the holding frame 21, using as the adhesive 28 a rubber adhesive G-10 (trade name; a product of Konishi Co., Ltd.).

On the support film 22, the plating electrode 24 was provided by resistive heating deposition of Cr and Au, successively. A multi-layer resist (three layers) was further provided as the resist 25. The multi-layer resist was constituted of a lower layer comprising a novolac resin, an intermediate layer comprising $SiO_2$ and an upper layer comprising an electron-beam resist OEBR-1000 (trade name; Tokyo Ohka Kogyo Co., Ltd.). In an electron-beam drawing apparatus EBM-130/40P (trade name; manufactured by Toshiba Machine Co., Ltd.), the electron-beam resist on the upper layer of the multi-layer resist was subjected to patterning under conditions of an accelerating voltage of 20 KV and a beam current of 200 nA. In a dry etching apparatus, the intermediate layer end the lower layer were further etched using $CF_4$ gas and $O_2$ gas, respectively. The resist pattern 25 was thus formed. Using a gold-plating solution Neutronex 309 (trade name; a product of EEJA Co.), gold-plating was carried out to form a gold absorber pattern 16 (0.8 μm thick), and then the resist 25 was removed. The electrode metal 24 was also removed by dry etching.

The accuracy of the absorber pattern 16 was inspected using the Electron Beam Metrogy System S-6000 (trade name; manufactured by Hitachi Ltd.) and the Laser Interferometric X-Y Measuring Machine Model 2I Lampus A2 (trade name; manufactured by Nikon Co.). As a result, it was possible to form an absorber pattern of 0.5 μm L/s corresponding to 16M DRAM with a position accuracy of 0.15 μm.

To the resulting mask structure, a magnetic member 27 comprised of a magnetic member ferrite stainless steel (SUS430) was fixed by adhesion using an epoxy adhesive 3500 (trade name; a product of Alfa Giken Co.). Used as the magnetic member 27 was the one previously processed so as to have a flatness of 2.0 μm and a surface roughness of 0.2 μm on its side which was not adhered to the holding frame 21, and subjected to rustproofing by further applying nickel-plating of 0.8 μm thick on the surface.

Example 3

A third example of the present invention will be described with reference to FIGS. 3A to 3F.

On a silicon wafer 31, a support film 32 comprising SiC (thickness: 2 μm) and an etching protective film 33 were formed by sputtering. The etching protective film 33 was subjected to patterning in the desired back-etched form. On the support film 32, Ta as an absorber 36 was deposited by sputtering to give a thickness of 0.8 μm, and a multi-layer resist (two layers) was provided thereon as a resist 35. The multi-layer resist was constituted of a lower layer comprising $SiO_2$ and an upper layer comprising an electron-beam resist RE-5000P (trade name; a product of Hitachi Chemical Co., Ltd.). In an electron-beam drawing apparatus MEBES-III (trade name; manufactured by Perkin Elmer Co.), the electron-beam resist on the upper layer was subjected to patterning under conditions of an accelerating voltage of 20 KV and a beam current of 100 nA. Then, the lower layer $SiO_2$ was subjected to dry etching using a mixed gas of $CF_4$ and $H_2$ to form a resist pattern 35. In a dry-etching apparatus, Ta was further etched using $CBrF_3$ gas. An absorber pattern 36 was thus formed. The silicon wafer 11 was subjected to back etching in a 30 wt. % KOH solution (70° C.).

The same inspection as Example 1 was carried out. As a result, it was possible to form an absorber pattern of 0.35 μm L/S corresponding to 64M DRAM with a position accuracy of 0.1 μm.

Figure 3A:
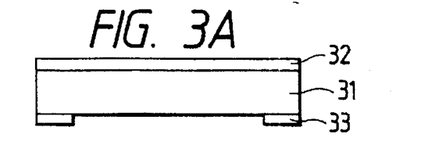
Figure 3B:
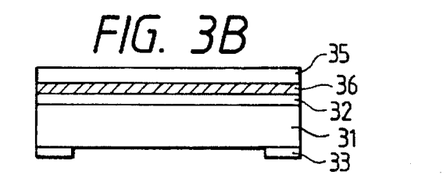
Figure 3C:
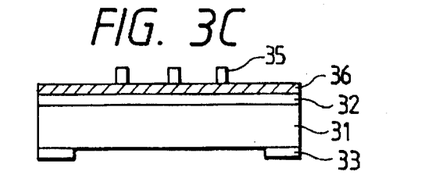
Figure 3D:
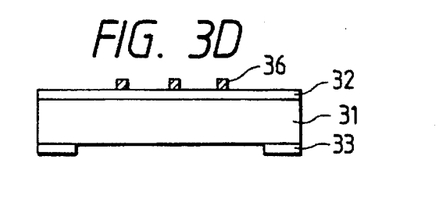
Figure 3E:
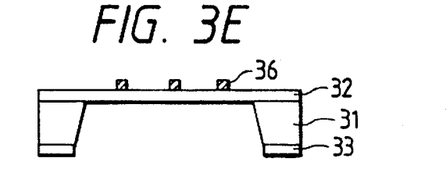
Figure 3F:
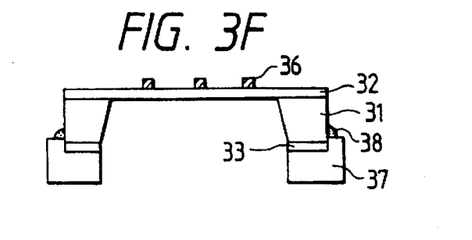

To the resulting mask structure, a reinforcement member 37 comprised of a magnetic member martensite stainless steel (SUS403) was adhered using an epoxy adhesive EP007 (trade name; a product of Cemedine Co., Ltd.). A terrace was formed on the face of the reinforcement member 37 contacting the holding frame 31, a portion of the holding frame was embedded in the reinforcement member 37, and then the member 37 and the frame 31 were fixed to each other by adhesion at the corner formed by the side face of the holding frame 31 and the top face of the reinforcement member 37 (as shown in FIG. 3F). Employment of this fixing means requires no adhesive 38 at the interface between the holding frame 31 and the reinforcement member 37, thus bringing about the advantage that no warpage, in the flatness and parallelism of the whole mask, is caused.

Used as the reinforcement member 37 was one previously processed so as to have a flatness of 1 μm and a surface roughness of 0.1 μm on a side thereof which was not adhered to the holding frame, and one which was subjected to rustproofing by further providing a TiN film (0.4 μm) on the surface.

Example 4

Figure 4:
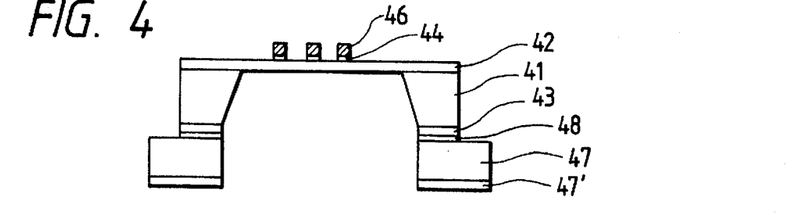
FIGS. 4 and 5 are schematic cross sections to illustrate the arrangement of X-ray mask structures obtained in the present invention.

Another example of the present invention will be described with reference to FIG. 4.

First, a BN-polyimide composite support film 42 with a thickness ratio of 1:1 and a total thickness of 2 μm was formed on a silicon wafer (holding frame) 41 in the same manner as Example 1. On the resulting support film 42, a plating electrode 44 was provided by continuous resistance heat deposition of Cr and Au. OEBR-1000 (trade name; Tokyo Ohka Kogyo Co., Ltd.) was further coated as an electron-beam resist 15 with a thickness of 1 μm. In an electron-beam drawing apparatus MEBES-III (trade name; manufactured by Perkin Elmer Co.), a resist pattern was formed under conditions of an accelerating voltage of 20 KV and a beam current of 100 nA. Using a gold-plating solution Neutronex 309 (trade name; a product of EEJA Co.), gold-plating was carried out to form a gold absorber pattern 46 (0.8 μm thick). The electrode metal 44, from which the resist was removed, was also removed by dry etching.

To the resulting mask structure, a reinforcement member 47 was adhered using an acrylic adhesive 48, Type No. G5510 (trade name; a product of Denka Co., Ltd.). The above reinforcement member 47 comprises a non-magnetic material such as Pyrex glass, a low-expansion glass, or quartz glass.

The accuracy of the absorber pattern 46 was inspected using the Electron Beam Metrogy System S-6000 (trade name; manufactured by Hitachi Ltd.) and the Laser Interferometric X-Y Measuring Machine Model 2I Lampus A2 (trade name; manufactured by Nikon Co.). As a result, it was possible to form an absorber pattern of 0.25 μm L/S corresponding to 256M DRAM with a position accuracy of 0.1 μm.

On the bottom surface of the reinforcement member 47, a magnetic member 47' was formed by electroless Ni-plating and thereafter, electrolytic Co-Ni-plating. As rustproofing, Ni-plating was further applied thereon. In the film formation of the magnetic member 47', vacuum deposition or the like may be used. The holding frame 41 and reinforcement member 47 had substantially the same shapes as those in Example 1, and the face of the reinforcement member 47 which was not adhered to the holding frame 41 had been processed so as to have a flatness of 1 μm and a surface roughness of 0.1 μm.

Example 5

Figure 5:
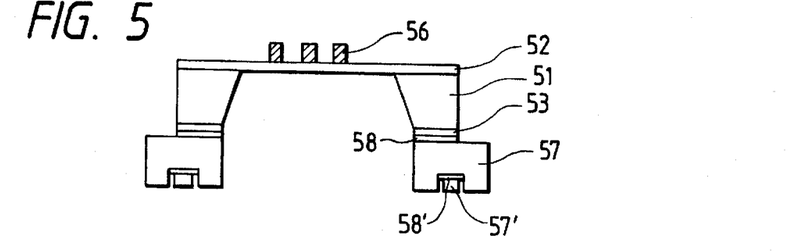

Another example of the present invention will be described with reference to FIG. 5.

First, a support film 52 made of AlN with a thickness of 2 μm was formed on a silicon wafer (holding frame) 51 in the same manner as Example 1. On the resulting support film 52, W as an absorber 56 was deposited by sputtering to give a thickness of 0.8 μm, and a multi-layer resist (two layers) was further provided thereon as a resist. The multi-layer resist was constituted of a lower layer comprising polyimide resin and an upper layer comprising a Si-containing electron-beam resist SNR (trade name; a product of Toyo Soda Manufacturing Co., Ltd.). In an electron-beam drawing apparatus EBM-130/40P (trade name; manufactured by Toshiba Machine Co. Ltd.), the electron-beam resist on the upper layer was subjected to patterning under conditions of an accelerating voltage of 20 KV and a beam current of 200 nA. Then, the lower layer was subjected to dry etching using an $O_2$ gas to form a resist pattern. W was further etched using $SF_6$ gas. An absorber pattern 56 was thus formed.

To the resulting mask structure, a reinforcement member 55 was fixed by adhesion using an epoxy adhesive Type No. 3500 (trade name; a product of Alfa Giken Co.). The reinforcement member 57 was comprised of ceramic SHAPAL M (trade name; a product of Tokuyama Soda Co., Ltd.).

The accuracy of the absorber pattern 56 was inspected using the Electron Beam Metrogy System S-6000 (trade name; manufactured by Hitachi Ltd.) and the Laser Interferometric X-Y Measuring Machine Model 2I Lampus A2 (trade name; manufactured by Nikon Co.). As a result, it was possible to form an absorber pattern of 0.15 μm L/S corresponding to 16M DRAM with a position accuracy of 0.15 μm.

In a recession made in the bottom surface of the reinforcement member 57, a ring-shaped magnetic member 57' comprising ferrite stainless steel (SUS430) was fixed by adhesion using an adhesive 58'. The ring-shaped magnetic member 57' was previously processed so as to have a flatness of 1 μm and a surface roughness of 0.08 μm on its side which was not adhered to the reinforcing member 57, and was subjected to rustproofing by further applying SiN with a thickness of 0.4 μm on its surface.

Comparative Example

Preparation steps of a comparative example of the present invention will be shown with reference to FIGS. 6A to 6G.

Figure 6A:
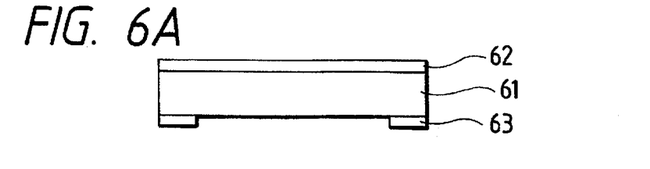
FIGS. 6A to 6G are schematic cross sections of an X-ray mask structure, to illustrate a comparative example of the present invention.
Figure 6B:
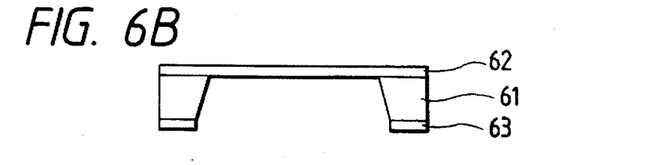
Figure 6C:
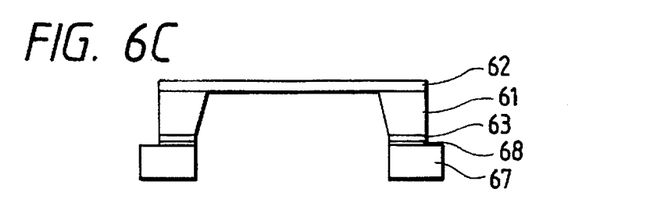

In the same manner as Example 1, a support film 62 and etching protective film 63 are formed on a silicon wafer 61, and then the silicon wafer 61 was subjected to back etching. What was different from Example 1 was that a reinforcement member 67 which was a magnetic member was fixed by adhesion using an adhesive 68 at the stage as shown in FIG. 6C.

Figure 6D:
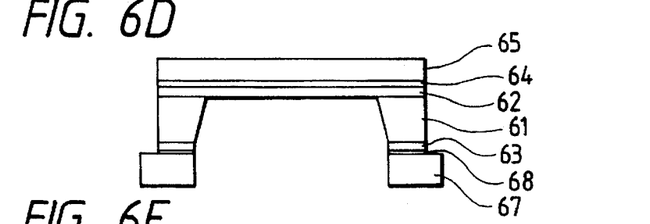
Figure 6E:
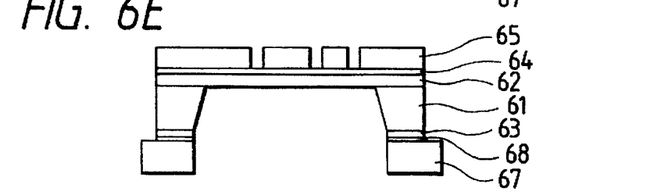

Thereafter, in the same manner as Example 1, a plating electrode 64 and a resit 65 were provided. Then, in an electron-beam drawing apparatus MEBES-III (trade name; manufactured by Perkin Elmer Co.), the resist pattern 65 was formed under conditions of an accelerating voltage of 20 KV and a beam current of 100 nA, when the position accuracy of the resist pattern 65 was inspected using a light wave interference coordinate meter Lampus A2 (trade name; manufactured by Nikon Co.). As a result, as large as 10 μm misregistration of the resist pattern occurred at some places, because of the nonhomogeneous distribution of the magnetic field.

Figure 6F:
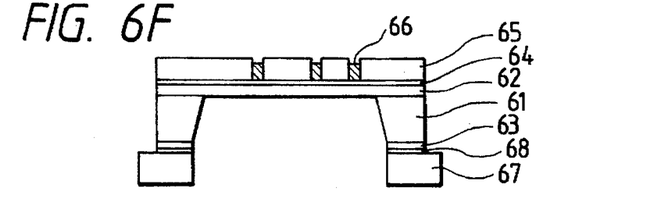
Figure 6G:
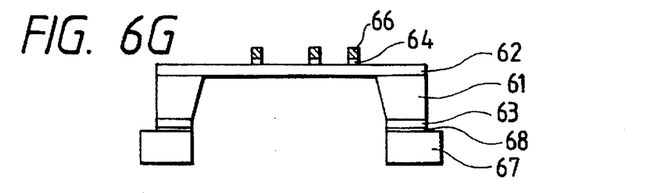

Using a gold-plating step in the same manner as Example 1, an absorber pattern 66 was formed. Then, in the Electron Beam Metrogy System S-6000 (trade name; manufactured by Hitachi Ltd.), the accuracy of the absorber pattern 66 was observed at an accelerating voltage of 1 KV. As a result, there was a difference of 47 μm, at maximum, in pattern position measurement between the results obtained by the Electron Beam Metrogy System and those obtained by the Laser Interferometric X-Y Measuring Machine Model 2I Lumpus A2.

As having been described above, according to the present invention, an X-ray absorber pattern can be formed on the support film with a good position accuracy. Similar effects can be seen when charged particles, such as focused ion beams used in mask modificaton or the like, are used.

One face (the face used for chucking) of the magnetic member used in the present invention is abraded to have a surface roughness of not more than 0.2 μm and a flatness of not more than 2 μm, so that the gap to the mask chuck of the exposure apparatus side can be reduced and the chucking by magnetic force can be made firmer.

The rustproofing previously carried out on the magnetic member can eliminate the problems of parallel warpage of the resulting mask structure, and of dusting.

What is claimed is:

1. A method of making an X-ray mask structure having an X-ray absorber in a desired pattern on the surface of a support film held by a frame, wherein the frame and the support film are each comprised of a non-magnetic material, said method comprising the steps of:

patterning the X-ray absorber on the support film held by the frame, which has no magnetic material, said patterning step comprising a drawing step that utilizes an electron beam;

thereafter providing the frame with a magnetic member; and subjecting the magnetic member to rustproofing.

2. A method of making an X-ray mask structure according to claim 1, wherein the support film comprises an X-ray transparent film.

3. A method of making an X-ray mask structure according to claim 1, further comprising joining the frame and the magnetic member together.

4. A method of making an X-ray mask structure according to claim 1, wherein said step of subjecting the magnetic member to rustproofing comprises coating the magnetic member with one of a ceramic and a metal plating.

5. A method of making an X-ray mask structure according to claim 1, further comprising subjecting the magnetic member to abrasion processing to have a surface roughness of not more than 0.2 μm and a flatness of not more than 2 μm.

6. A method of making an X-ray mask structure having an X-ray absorber in a desired pattern on the surface of a support film held by a frame, wherein the frame and the support film are each comprised of a non-magnetic material, said method comprising the steps of:

patterning the X-ray absorber on the support film held by the frame, which has no magnetic material, said patterning step comprising a drawing step that utilizes an electron beam;

thereafter joining the frame to a reinforcement member, at least a portion of which comprises a magnetic member; and subjecting the magnetic member to rustproofing.

7. A method of making an X-ray mask structure according to claim 6, wherein the support film comprises an X-ray transparent film.

8. A method of making an X-ray mask structure according to claim 6, wherein said step of subjecting the magnetic member to rustproofing comprises coating the magnetic member with one of a ceramic and a metal plating.

9. A method of making an X-ray mask structure according to claim 6, further comprising shaping the reinforcement member in a ring shape, similar to the frame.

10. A method of making an X-ray mask structure according to claim 6, further comprising adhering the frame to the reinforcement member.

11. A method of making an X-ray mask structure according to claim 6, further comprising subjecting the reinforcement member to abrasion processing to have a surface roughness of not more than 0.2 μm and a flatness of not more than 2 μm on a face of the member, which face opposes a frame-joining face of the member.

12. A method of making an X-ray mask structure having an X-ray absorber in a desired pattern on the surface of a support film held by a frame, wherein the frame and the support film are each comprised of a non-magnetic material, said method comprising the steps of:

patterning the X-ray absorber on the support film held by the frame, which has no magnetic material, said patterning step comprising a drawing step that utilizes an electron beam;

thereafter embedding a magnetic member in a recession in the frame; and subjecting the magnetic member to rustproofing.

13. A method of making an X-ray mask structure according to claim 12, further comprising forming the magnetic member in a ring shape, similar to the frame.

14. A method of making an X-ray mask structure according to claim 12, further comprising adhering the magnetic member to the frame.

15. A method of making an X-ray mask structure according to claim 12, wherein said step of subjecting the magnetic member to rustproofing comprises coating the magnetic member with one of a ceramic and a metal plating.

16. A method of making an X-ray mask structure having an X-ray absorber in a desired pattern on the surface of a support film held by a frame, wherein the frame and the support film are each comprised of a non-magnetic material, said method comprising the steps of:

patterning the X-ray absorber on the support film held by the frame, which has no magnetic material, said patterning step comprising a drawing step that utilizes an electron beam;

inspecting the accuracy of the absorber patterns, said inspecting step comprising a measuring step that utilizes an electron beam;

thereafter providing the frame with a magnetic member; and subjecting the magnetic member to rustproofing.

17. A method of making an X-ray mask structure according to claim 16, wherein the support film comprises an X-ray transparent film.

18. A method of making an X-ray mask structure according to claim 16, further comprising joining the frame and the magnetic member together.

19. A method of making an X-ray mask structure according to claim 16, wherein said step of subjecting the magnetic member to rustproofing comprises coating the magnetic member with one of a ceramic and a metal plating.

20. A method of making an X-ray mask structure according to claim 16, further comprising subjecting the magnetic member to abrasion processing to have a surface roughness of not more than 0.2 μm and a flatness of not more than 2 μm.

21. A method of making an X-ray mask structure having an X-ray absorber in a desired pattern on the surface of a support film held by a frame, wherein the frame and the support film are each comprised of a non-magnetic material, said method comprising the steps of:

patterning the X-ray absorber on the support film held by the frame, which has no magnetic material, said patterning step comprising a drawing step that utilizes an electron beam;

inspecting the accuracy of the absorber patterns, said inspecting step comprising a measuring step that utilizes an electron beam;

thereafter joining the frame to a reinforcement member, at least a portion of which comprises a magnetic member; and subjecting the magnetic member to rustproofing.

22. A method of making an X-ray mask structure according to claim 21, wherein the support film comprises an X-ray transparent film.

23. A method of making an X-ray mask structure according to claim 21, wherein said step of subjecting the magnetic member to rustproofing comprises coating the magnetic member with one of a ceramic and a metal plating.

24. A method of making an X-ray mask structure according to claim 21, further comprising shaping the reinforcement member in a ring shape, similar to the frame.

25. A method of making an X-ray mask structure according to claim 21, further comprising adhering the frame to the reinforcement member.

26. A method of making an X-ray mask structure according to claim 21, further comprising subjecting the reinforcement member to abrasion processing to have a surface roughness of not more than 0.2 µm and a flatness of not more than 2 µm on a face of the member, which face opposes a frame-joining face of the member.

27. A method of making an X-ray mask structure having an X-ray absorber in a desired pattern on the surface of a support film held by a frame, wherein the frame and the support film are each comprised of a non-magnetic material, said method comprising the steps of:

patterning the X-ray absorber on the support film held by the frame, which has no magnetic material, said patterning step comprising a drawing step that utilizes an electron beam;

inspecting the accuracy of the absorber patterns, said inspecting step comprising a measuring step that utilizes an electron beam;

thereafter embedding a magnetic member in a recession in the frame; and subjecting the magnetic member to rustproofing.

28. A method of making an X-ray mask structure according to claim 27, further comprising forming the magnetic member in a ring shape, similar to the frame.

29. A method of making an X-ray mask structure according to claim 27, further comprising adhering the magnetic member to the frame.

30. A method of making an X-ray mask structure according to claim 27, wherein said step of subjecting the magnetic member to rustproofing comprises coating the magnetic member with one of a ceramic and a metal plating.

* * * * *

UNITED STATES PATENT AND TRADEMARK OFFICE
CERTIFICATE OF CORRECTION

PATENT NO.    : 5,656,398
DATED         : August 12, 1997
INVENTOR(S)   : TAKESHI MIYACHI, et al.

It is certified that error appears in the above-indentified patent and that said Letters Patent is hereby corrected as shown below:

COLUMN 1:

Line 49, "(Electrons)," should read --(electrons),--.

COLUMN 5:

Line 60, "end" should read --and--.

COLUMN 6:

Line 6, "L/s" should read --L/S--.

COLUMN 8:

Line 51, "at" should read --at a--.

Signed and Sealed this

Third Day of March, 1998

*Attest:*

BRUCE LEHMAN

*Attesting Officer*      *Commissioner of Patents and Trademarks*